United States Patent [19]

Schwartz et al.

[11] Patent Number: 5,706,192
[45] Date of Patent: Jan. 6, 1998

[54] ANTIPHASE SWITCHING IN ARRAYS OF GLOBALLY COUPLED OSCILLATORS

[75] Inventors: Ira B. Schwartz, Bethesda, Md.; Kwok Yeung Tsang, Springfield, Va.

[73] Assignee: The United States of America as represented by the Secretary of the Navy, Washington, D.C.

[21] Appl. No.: 558,430

[22] Filed: Nov. 16, 1995

[51] Int. Cl.$^6$ .................................................. G05B 13/02
[52] U.S. Cl. ........................... 364/148; 364/152; 364/176
[58] Field of Search ................................ 364/148, 152, 364/158, 159, 176; 380/46, 48; 331/78, 46, 50, 56

[56] References Cited

U.S. PATENT DOCUMENTS

| | | | |
|---|---|---|---|
| 4,479,176 | 10/1984 | Grimshaw | 364/148 |
| 5,402,334 | 3/1995 | Pecora et al. | 364/158 |
| 5,404,298 | 4/1995 | Wang et al. | 364/152 |
| 5,432,697 | 7/1995 | Hayes | 364/158 |
| 5,442,510 | 8/1995 | Schwartz et al. | 364/152 |
| 5,510,976 | 4/1996 | Tanaka et al. | 364/165 X |

OTHER PUBLICATIONS

L. M. Pecora et al., Pseudoperiodic Driving : Eliminating Multiple Domains of Attraction using Chaos, 67 Physical Review Letters 945 (No. 8, Aug. 19, 1991).

L. M. Pecora et al., Driving Systems with Chaotic Signals, 44 Physical Review letters 2374 (No. 4, Aug. 15, 1991).

T. W. Carr and I. B. Schwartz, Controlling with High-Dimensional Unstable Steady States using Delay, Duration, and Feedback, Physica D (1996).

I. B. Schwartz et al., Antiphase Switching in Josephson Junction Arrays, 73 Physical Review Letters 2797 (No. 21, cover dated Nov. 21, 1994).

Letter of Oct. 16, 1995, from Barbara Maddaloni of the American Physical Society to Edward F. Miles, re AA, above.

P. Hadley et al., Phase Locking of Josephson-Junction Series Arrays, 38 Physical Review B 8712 (No. 13, Nov., 1988).

K. W. Tsang et al., Attractor Crowding in Josephson Junction Arrays, 56 Applied Physics Letters 495 (No. 5, Jan. 29, 1990).

I. B. Schwartz et al., Predicting attracting Out-of-Phase States In Coupled Josephson Junctions, 2 International Journal of Bifurcation and Chaos 177 (No. 1, 1992).

(List continued on next page.)

*Primary Examiner*—Joseph Ruggiero
*Attorney, Agent, or Firm*—Thomas E. McDonnell; Edward F. Miles

[57] ABSTRACT

A method and apparatus for accessing anti-phase states in a nonlinear system by globally coupling an array of oscillators. For N number of oscillators in the system, there are $(N-1)!$ anti-phase (AP) states in phase space. AP states exist where each waveform is staggered out-of-phase with every other wave form. The system is controlled between AP states by means of a linear parameter and a hyper-switch. In an out-of-phase (OP) state the orbit remains on a basin boundary between or among AP states. As the linear parameter is decreased to a specific value, the orbit leaves the basin boundary and enters a canonical invariant region (CIR) towards an attractor. Each CIR contains one AP state and one attractor. Once the orbit has reached an attractor within the CIR it shall remain there until the linear parameter is increased and system again becomes unstable. Accordingly, by controlling the bias current in the system, the orbit may remain on the basin boundary until such time as the bias current is altered and forces the orbit into an invariant region thereby attaining an AP state. Furthermore, if the orbit is in a CIR, the bias current may be adjusted so that the system becomes unstable and returns to the basin boundary. This method of accessing different AP states in a system of globally coupled oscillators uses a hyperswitch together with control and release techniques for switching between or among AP states by pulsing a linear parameter.

31 Claims, 6 Drawing Sheets

OTHER PUBLICATIONS

K. Wiesenfeld et al., Attractor Crowding in Oscillator Arrays, 62 Physical Review Letters 1335 (No. 12, Mar. 20, 1989).

J. W. Smith et al., Averaging of Globally Coupled Oscillators, Physica D (1992).

K. W. Tsang et al., On the Comparison Between Josephson–Junction Array Variations, 70 Journal of Applied Physics 1075 (No. 2, Jul. 15, 1991).

FIG. 1
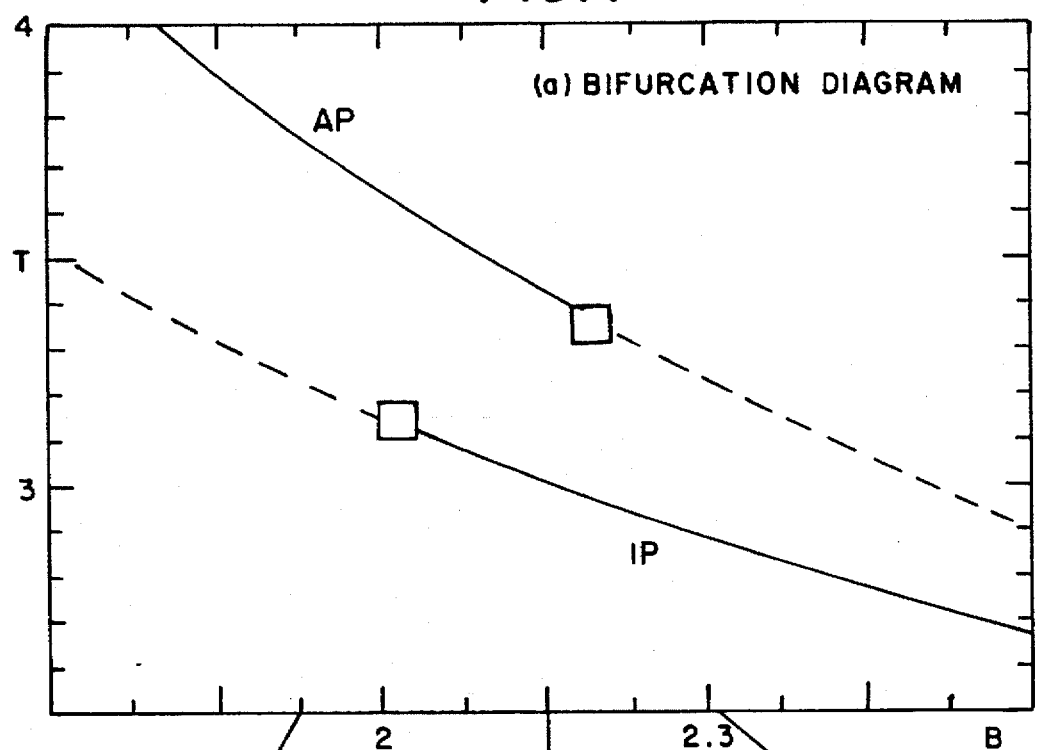
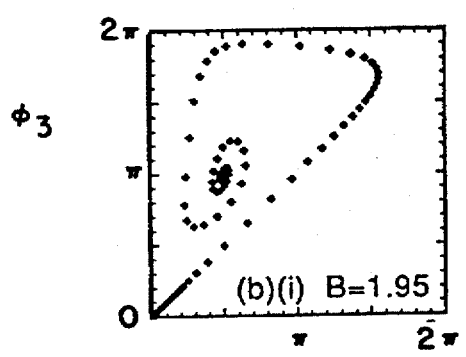
FIG. 1a
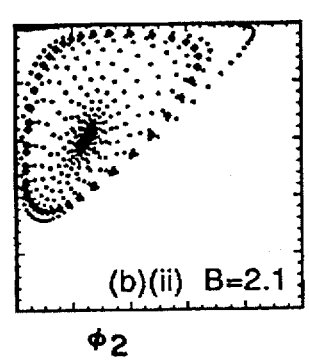
FIG. 1b
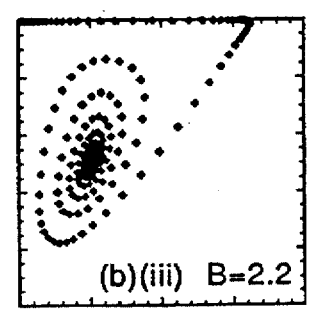
FIG. 1c

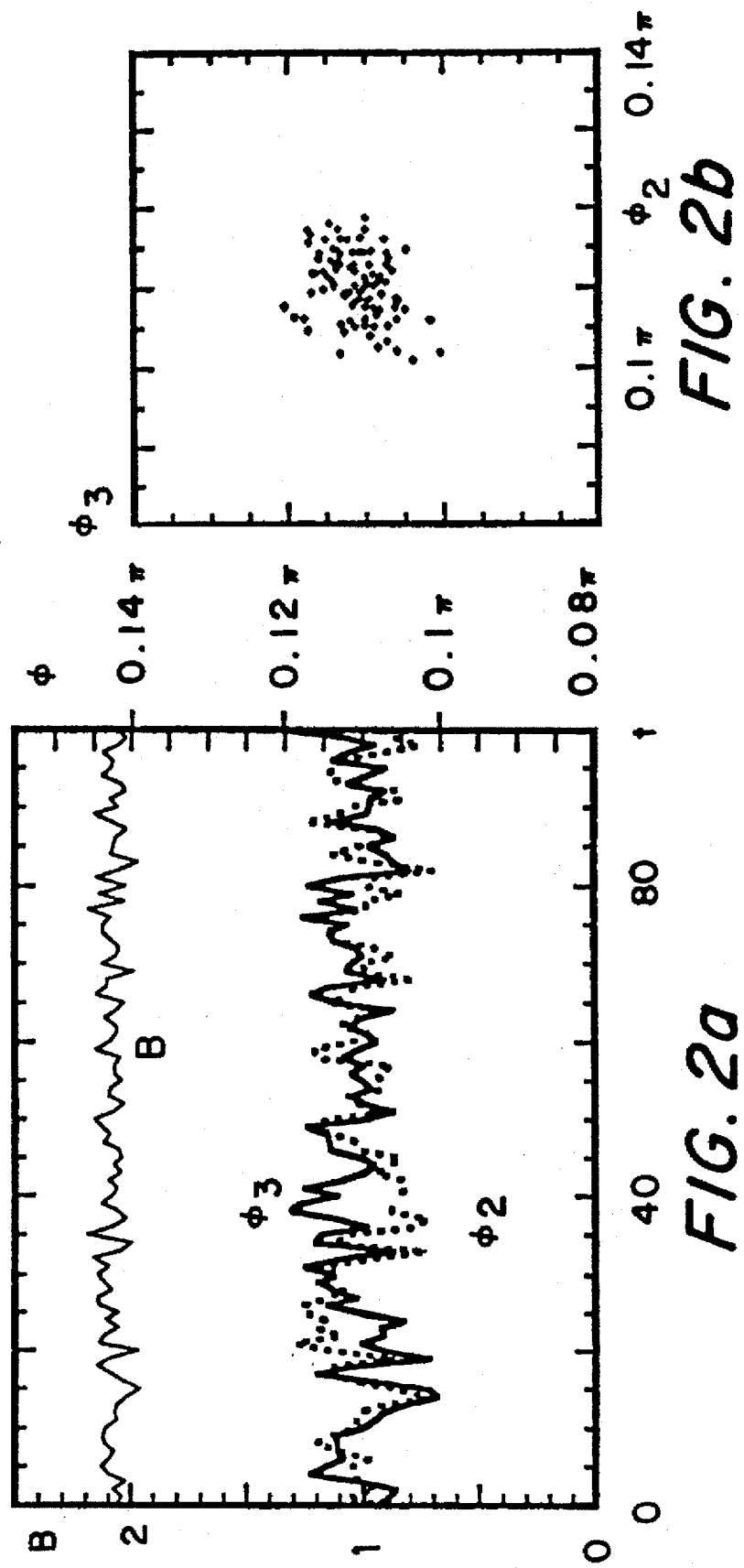

ANTIPHASE SWITCHING IN ARRAYS OF GLOBALLY COUPLED OSCILLATORS

BACKGROUND OF THE INVENTION

1. Field of the Invention

This invention relates to a method and apparatus for controlling nonlinear systems, and more particularly to a method of controlling a saddle on a basin boundary by switching between antiphase states.

2. Discussion of Related Art

Recent developments in nonlinear dynamics have shown that most nonlinear systems have steady-state, periodic or chaotic attractors in phase space. The chaotic attractors contain an infinite number of unstable periodic attractors.

A technique has been reported for stabilizing the nonlinear system in the neighborhood of unstable orbits by directing subsequent iterates towards the local stable manifold of the selected orbit. Ott, Grebogi and Yorke, "Controlling Chaos," Phys. Rev. Lett. 64, 1196 (1990)("OGY"). However, application of the OGY technique is not feasible if the periodic orbit or unstable steady state near which control is desired is not known. In addition, some operating conditions possessing dynamics which are not in the neighborhood of any identifiable orbit will not be accessible to control.

A further development in nonlinear dynamics includes a method and apparatus for using the natural complexity of chaos to carry information. See U.S. Pat. No. 5,432,697, to Hayes. The invention sends information via a chaotic signal without significantly altering the dynamics of the chaotic information carrier. This is accomplished by generating an information bearing waveform by controlling the symbolic dynamics of a chaotic system using microscopic perturbation, wherein the trajectory approximates a possible natural trajectory of the system.

However, no other methods or apparatus have been disclosed for accessing anti-phase states, and using these states as a means of increasing memory in a system. The disclosed apparatus and method uses an array of globally coupled oscillators and the unstable orbits therein for switching among anti-phase states. The technique combines modem control theory methods together with bifurcation theory to access the anti-phase states as a means for increasing memory in a system.

SUMMARY OF THE INVENTION

It is therefore an object of the invention to control a linear parameter in a nonlinear system.

Another object of the invention is to globally couple an array of oscillators, wherein each oscillator is connected to every oscillator in the system.

A further object of the invention is to access anti-phase states in phase space by means of pulsing a linear parameter.

A still farther object of the invention is to switch among the anti-phase states in the system by means of a hyperswitch, which implements control and release procedures for pulsing a linear diameter from a basin boundary between or among canonical invariant regions (CIRs).

In accordance with the invention, these and other objectives are achieved by globally coupling at least three oscillators, and pulsing a linear parameter by means of a hyperswitch to access the anti-phase states in the system. The invention has two parts for accessing the anti-phase states: a control procedure and a release procedure. The control procedure maintains the linear parameter such that it remains on a basin boundary in an out-of-phase state between or among anti-phase states. The release procedure allows the system to access the anti-phase state by pulsing the linear parameter such that the system orbits toward an attractor in the anti-phase state. After the system has reached the anti-phase attractor in the invariant region, the linear parameter is again altered so that the system exits the invariant region and returns to the basin boundary between or among CIRs.

Aspects of the invention are addressed in the article by Schwartz and Tsang, *Antiphase Switching in Josephson Junction Arrays*, PHYSICAL REVIEW LETTERS vol. 73, no. 21, pp. 2797 ff., the substance of which is incorporated herein by reference.

BRIEF DESCRIPTION OF THE DRAWINGS

These and other objects, features and advantages of the invention, as well as the invention itself, will become better understood by reference to the following detailed description when considered in connection with the accompanying drawings, wherein:

FIG. 1 is a bifurcation diagram of an array of three Josephson Junctions connected in series and globally coupled;

FIG. 1a is a surface section of a canonical invariant region (CIR) of the second and third junctions when the phase of the first junction $\theta_1=0 (mod 2\pi)$ with a bias current of 1.95;

FIG. 1b is a surface section of a CIR of the second and third junctions when the phase of the first junction $\theta_1=0 (mod 2\pi)$ with a bias current of 2.1;

FIG. 1c is a surface section of a CIR of the second and third junctions when the phase of the first junction $\theta_1=0 (mod 2\pi)$ with a bias current of 2.2;

FIG. 2a is a diagram of the bias current and phases of a controlled orbit for three Josephson junctions on the edge of the CIR where $\theta_2=\theta_3$, as a function t, where t represents the number of times that an orbit passes through the surface of the section.

FIG. 2b is a phase portrait showing that the controlled orbit visits both sides of the basin boundary under noise.

DETAILED DESCRIPTION OF THE PREFERRED EMBODIMENTS

Figure 5:
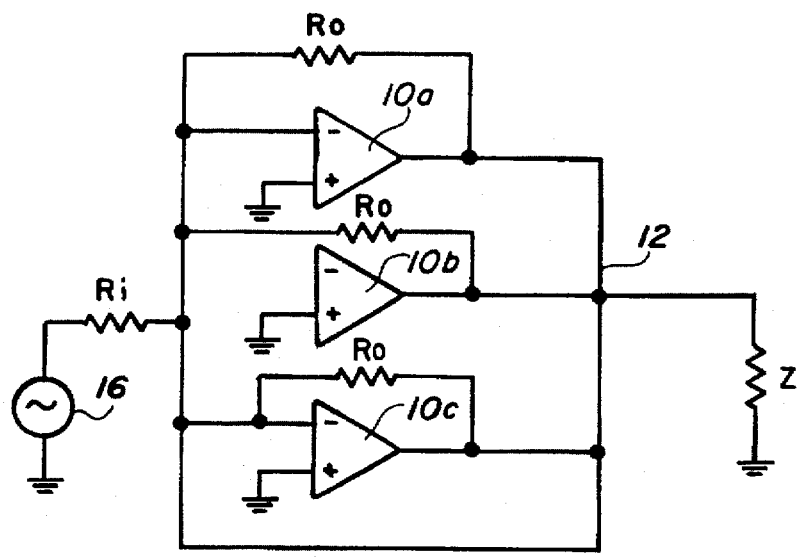
FIG. 5 is an example of a globally connected electronic circuit of three active elements.

Referring now to the drawings, FIG. 5 illustrates a system of three operational amplifiers $10_a$, $10_b$, $10_c$ globally connected, and driving a generalized load of impedance Z. The amplifiers have identical gain $R_o/R_i$, and their outputs are summed at 12, and fed back to the inverting inputs of the amplifiers at $14_a$, $14_b$, $14_c$, respectively, to effect global coupling. Current source 16 drives the system, and could, e.g., constitute the parameter by which the system could be controlled according to the invention.

Figure 6:
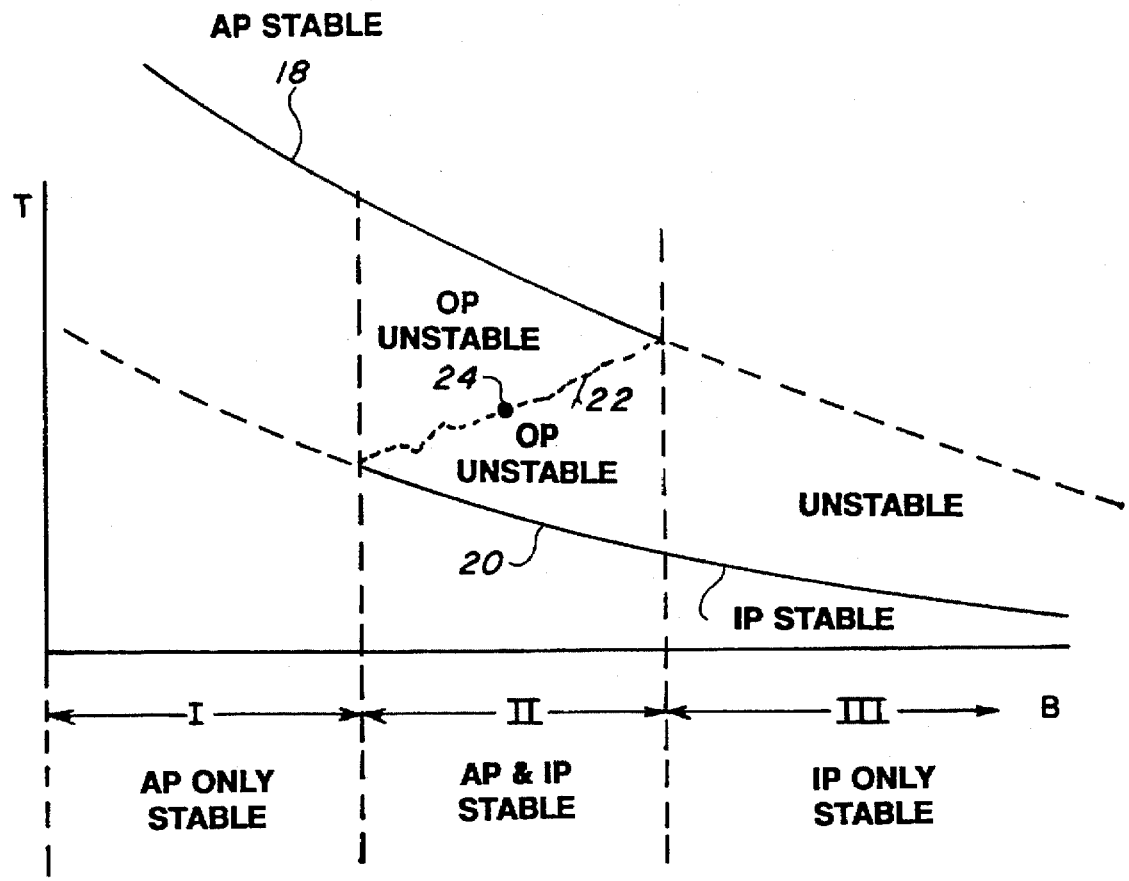
FIG. 6 is a graph (a bifurcation diagram) illustrating regions of stability and instability for a typical globally connected system.

FIG. 6 shows a typical bifurcation diagram of a generalized globally connected system, which is a plot of the period T of the elements of the system as a function of the parameter, arbitrarily called B, which is used to drive the system among different states. Above curve 18 antiphase states ("AP") can exist, and are stable in the portion of curve 18 which is solid. Similarly, below curve 20 inphase states ("IP") can exist, and are stable in the portion of curve 20 which is solid. As a consequence, in region I of FIG. 6, only antiphase states can exist stably, in region III only inphase states can exist, and in region II both can exist. The portion of region II between the solid portions of lines 18 and 20 is the region of the diagram in which the antiphase states and the in phase state of the system can co-exist stably. Dotted line 22 represents a demarcation at which the system is out of phase. One begins by driving the system to an antiphase state in region I, and then increasing B to drive the system to region III. In region III, the system is naturally attracted towards a state on the solid portion of line 20. Prior to settling on line 20, one reduces the value of B to bring the system to a state near point 24. At point 24 the tendency to drift one way or the other is essentially balanced, and thus provides a natural point of departure to reach any of the antiphase states (or, for that matter, the out of phase state).

Figure 7:
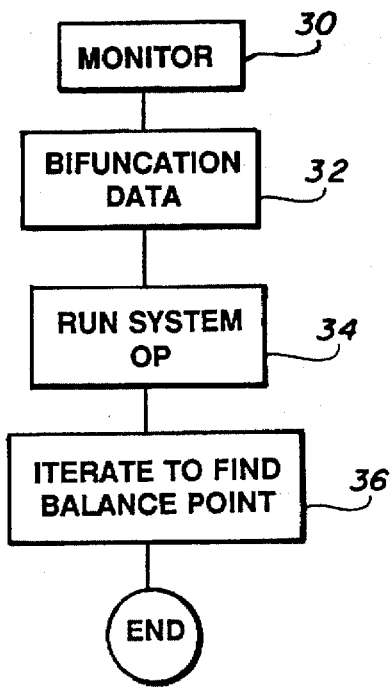
FIG. 7 is a flow chart illustrating calibration of a system according to the invention.
Figure 8:
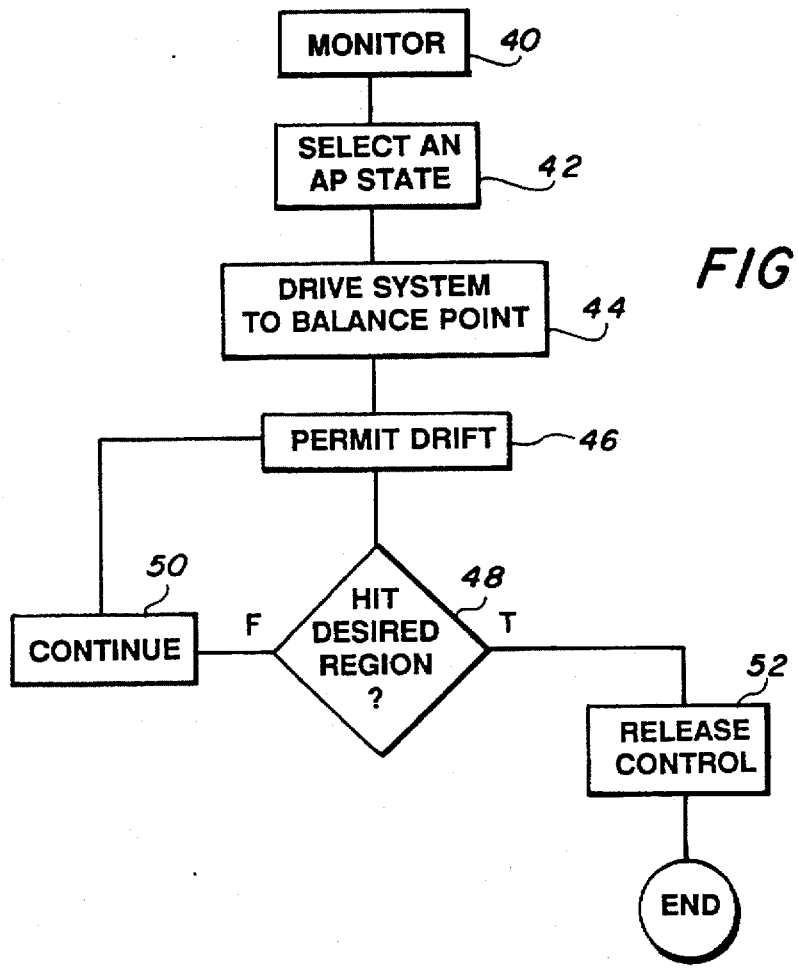
FIG. 8 is a flow chart illustration switching among antiphase states, according to the invention.

FIGS. 7–8 shows how one would do this selectively. As illustrated in FIG. 7, one begins by monitoring the output phases of the system's elements (e.g., for the system of FIG. 5 the output phase of each amplifier 10) (30 in FIG. 7). This monitoring is done continuously, and the phases recorded as they evolve over time. One then varies the selected variable of the system sufficiently to permit construction of a bifurcation diagram like that of FIG. 6 (32). One then sets the value of B to drive the system near demarcation line 24 (34), and notes how the system drifts away towards stable antiphase or inphase states. One then applies any of a number of conventional systems control techniques to iteratively stabilize the system near 24 (the "saddle point") (36). At this point the system is properly calibrated.

FIG. 8 illustrates switching among selected antiphase states. One continuously monitors the phase of the output of system elements (40), and selects a desired antiphase state to address (42). One then uses the information obtained by the steps of FIG. 7 to set parameter B to drive the system to balance point 24 (44). The system being effectively perched on a narrow balance in phase space among the system's antiphase, any practical system will dither about this point (46). While in region II of the bifurcation diagram, one then waits until the system drifts to a point in a region with the desired phase ordering, which contains the desired antiphase state. The system is naturally attractive to the desired antiphase state (48), at which point parameter B is reset to drive the system into region I, locking the system into the desired antiphase state (52).

FIG. 1 shows a bifurcation diagram of an array of three globally coupled Josephson Junctions. The invention has broad scope and applies to control of nonlinear systems of any nonlinear oscillatory system, such as optical waveguides, electronic circuits, multi-mode lasers, neural networks, coupled semi-conductors, semi-conductor lasers and solid state lasers. Furthermore, the invention is only limited to a minimum number of junctions, beginning with three, and is not limited to a maximum number of junctions.

For a set of identical oscillators globally coupled, there are three classes of solutions. When all of the oscillators in the system (N) have the same waveform and all the oscillators are in phase with each other, the array of oscillators is in an in-phase-state (IP). However, if all of the oscillators in the system (N) have a period of oscillation T, and each of the oscillators have the same wave form but each wave is staggered out-of-phase with every other wave form by T/N, the array of oscillators is in an AP state, also known as a splay state. All other states of relative phases of the oscillators in the system are defined to be out-of-phase (OP), which is generally somewhere between IP and AP states. In a system of N globally coupled oscillators, there is only one IP state in phase space. This IP state corresponds to the state in which all of the oscillators (N) in the system fire, or peak, simultaneously. The simultaneous peaking of each oscillator occurs independent of how the oscillators are ordered.

In a system of N number of oscillators globally coupled, there are (N−1)! distinct AP states. Each AP state in the system corresponds to a permutation of the firing order of each of the oscillators with respect to the other oscillators in the system, wherein each permutation can correspond to information, i.e. an ASCI character. Global coupling of all the oscillators in the system imposes a high degree of symmetry in the dynamics of the system as a whole. This symmetry allows us to predict and access these AP states. Although the examples disclosed herein are for a system of three and four oscillators globally coupled, this system design is functional for a large array of globally coupled oscillators. It is suggested that one may access these AP states in the design of high content addressable associative memory as well as for enabling pattern recognition. For the system example of three oscillators described herein, there are only two AP. However, for a system of eleven oscillators, there would be 3,628,800 AP states. The idea of accessing and using these AP states as potential memory is unique and offers a substantial increase in memory.

The following system comprises an array of Josephson junctions connected in series and globally coupled. Every junction is connected to every other junction. The global coupling of the oscillators creates a non-linear system which is a unique and distinctive feature of the invention. The symmetry that results from this system provides a high degree of symmetry and allows prediction and accessibility to the AP states, as will be explained. An equation describing the phase of an individual oscillator in the system is given by:

$$\theta_k + \sin\theta_k + I = B + n_k(t); \qquad \text{Eq. 1}$$

The above equation is used to describe a model wherein k is an index ranging over the number of oscillators in the model, with a minimum of three junctions, I is the current through the circuit, B is the bias current, and n represents the noise term which is independent for each oscillator. The system is further described by the time rate of change of the current proceeding through the circuit, as follows:

$$L\dot{I} + \frac{Q}{C} = \frac{1}{N}\sum_{j=1}^{N}\dot{\theta}_k \qquad \text{Eq. 2}$$

Equation 2, shown above, further models the apparatus of globally coupled oscillators described above, with the inductance being L, the capacitance being C, the charge being Q, N being the number of globally coupled oscillators in the system, and the "dot" denotes d/dt.

The following boundaries and definitions are set in order to solve Eq. 1 as a two point boundary value problem for determining stable and unstable branches of IP and AP states in the system as a function of the bias current, B, and where T is defined as the period of oscillation:

$$\theta_k(T)=\theta_k(0)+2\pi$$

$$I(0)=I(T)$$

$$Q(0)=Q(T)$$

FIG. 1 illustrates the relationship between the bias current, B, and the period of oscillation, T, where the boundaries are defined as indicated above. In the following example, the inductance and capacitance are set at the following values:

$$L=0.5$$

$$C=0.5$$

Where L and C are in system relative units, such as are used, e.g., in the paper by Tsang et al., *On the Comparison Between Josephson-Junction Array Variations*, J. Applied Physics, vol. 70 (no. 2) (Jul. 15, 1991).

Referring to FIG. 1, the solid lines represent the stable regions in the system and the dashed lines represent the unstable regions in the system. Since the charge Q is equal to the time rate of change of the current, I, i.e. I=dQ/dt through the system, and the capacitance and the inductance are constant, the only variable subject to change in this nonlinear system is the bias current B. As shown in FIG. 1, the AP state is attracting for values of B less than 2.0, hereafter defined as $B_1$. FIG. 1 further illustrates that the IP state is only attracting for values of B greater than 2.131, hereafter defined as $B_2$.

The interval defining the limits of the bias current B is defined as J, wherein J=($B_1$, $B_2$). In the interval J, both IP and AP states co-exist as attracting orbits. Since both IP and AP states coexist in the interval J, and both states are attracting in this interval, they are separated by a basin boundary consisting of a repelling quasiperiodic orbit.

The orbits of the oscillators are illustrated in FIG. 1a, 1b and 1c. The heavy dots illustrated in these three figures represent unstable orbits, aka. quasiperiodic orbits, and the smaller dots represent two orbits attracted to the IP and AP states. Each of these graphic illustrations is a discrete dynamical picture of a map of $\theta_2$ and $\theta_3$, wherein the phase of the first junction, $\theta_1$, of the first oscillator is defined as $\theta_1=0(\mod 2\pi)$. FIGS. 1a–c show the map of $\theta_2$ and $\theta_3$ as the phase of $\theta_1=0(\mod 2\pi)$ for B=1.95, B=2.1 and B=2.2, respectively. The dynamics of the system is strictly ordered by the relative phases of each oscillator in the system, and is shown in the illustration confined to the corresponding half of the square. There is only one AP state pictured in the region illustrated, which is known as a canonical invariant region (hereinafter CIR). When the system enters the CIR of an AP state, it orbits toward an attractor, see FIG. 1a. The system win remain in the AP state in the CIR until such time as the system is shocked, at which point the orbit will be affected.

As shown in FIGS. 1a–c, as the value of B is increased, the circle shrinks in size, and as the value of B is decreases, the invariant circle expands. FIG. 1a is a discrete representation of the second and third oscillators, $\theta_2$ and $\theta_3$, as the first oscillator, $\theta_1=0(\mod 2\pi)$ when the value of B=1.95. As seen in FIG. 1, the AP state is attracting for B<2.0, and this is clearly seen in FIG. 1a where the system is launched from an unstable orbit and spirals toward an attractor of an AP state in one of the CIRs. The other extreme is FIG. 1c where B=2.2. In this illustration B>2.131 and the AP state is in the middle of the illustration and the system spirals out toward the IP state. The third illustration, FIG. 1b, is where B=2.1, wherein $B_1$<B<$B_2$. For values of B in this interval, both IP and AP states are attracting periodic orbits and are separated by a basin boundary consisting of repelling quasiperiodic orbits. As seen in FIG. 1, both AP and IP states coexist in this region. Accordingly, we see in FIG. 1b two coexisting attractors of IP and AP states separated by a basin boundary which is an unstable invariant circle.

As shown in the bifurcation diagram of FIG. 1 and the maps of FIG. 1a–c, the AP and IP exist as stable and unstable states in phase space for different values of the bias current. In each invariant region, the edges of the orbits have a key function. On each edge, the oscillators of the system are categorized into two groups. A first group of the oscillators is where the two oscillators being mapped are in-phase with each other, and a second group is a single oscillator. Typically, the first and second groups of oscillators are out of phase with each other. In the region where IP and AP states coexist as attractors, also known as the bistable regime, there is a saddle on each edge. An unstable manifold is contained on the edge, i.e. an out-of-phase state, while a stable manifold is contained in both invariant regions. Therefore, what is desired is that we maintain control so that the motion of the orbit is in a neighborhood of the boundary between these two invariant regions, i.e in an OP state, where access to the invariant regions may be controlled. A method of controlling operation of a non-linear system is disclosed more fully in U.S. Pat. No. 5,442,510 to Schwartz et al., which patent is incorporated herein by reference. The patent discloses an apparatus and method for tracking and controlling the operation of a non-linear system. The disclosed invention uses feedback for stabilizing the non-linear system at an operating point wherein control of the system is used to stabilize the non-linear system at an operating point corresponding to an applied parametric signal. The control brings the non-linear system towards a desired orbit and stabilizes the non-linear system near that orbit. Similarly, in a preferred embodiment, access to the invariant regions is attained by controlling the value of the bias current, B, so that only an AP state is attracting at a specific value, and that at other values, i.e. where the system is in an OP state, control of the system is maintained on a basin boundary.

The method of choosing between anti-phase states is executed by means of a control and release procedure. We therefore define the following terms:

$B_0$=a constant bias current;

$Z_F$=is a fixed point corresponding to a saddle on the edge of the basin boundary; and f=map of the bias current in phase space as $\theta_1=0(\mod 2\pi)$. Control of the nonlinear system in a neighborhood of a desired orbit, i.e. control of the saddle in an OP state on the boundary edge between or among invariant regions, is done by viewing the system discretely. There is a fixed point of the map of the bias current in phase space, f, such that $Z_F=f(Z_F, B_0)$. We further define the control parameter p for the system as $p=B-B_0$, and the deviation from the fixed point $\xi_n=Z_n-Z_F$. As we linearize the variables about the fixed point of $\xi_n=0$, we are left with the following equation for defining the system:

$$\xi_{n+1}=\xi_F(p)+A(\xi_n-\xi_F(p)) \qquad \text{Eq. 3}$$

The variable A is a matrix which is created by allowing the system to evolve without controlling the bias current, and by observing the time ordered points in a neighborhood of a fixed point. A least squares procedure is then implemented to generate the matrix A. The next step in developing the control and release parameters, is to compute the eigenvalues and eigenvectors from the matrix A. The eigenvalues and eigenvectors provide us with the stable and unstable manifolds, respectively in the neighborhood of the fixed point. In order to generate the rate of change of the fixed point in the direction of p, we define the vector g as:

$$g = \frac{\delta}{\delta p} \xi_F(p) \qquad \text{Eq. 4}$$

and approximate as p=0, $$g = \frac{1}{p} \xi_F(p) \qquad \text{Eq. 4a}$$

In practice, the value of g can be calculated experimentally once and kept constant for subsequent iterations during the control step for a particular value of p. This vector may also be generated directly from the time series by changing the parameter p a small amount and observing how the fixed point changes. By using the decomposition of the matrix A and the vector g, as defined in Eq. 3, we are left with the following:

$$\xi_{n+1} = p_n g + [\lambda_u e_u f_u + \lambda_s e_s f_s] \cdot (\xi_n + p_n g) \qquad \text{Eq. 5}$$

The variables $\lambda_i$, $e_i$ of Eq. 5 are the eigenvalues and eigenvectors of the matrix A from Eq. 3, and $f_u$ and $f_s$ are contravariant basis vectors. To perform small amplitude control, we choose $p_n$ such that the iterates $\xi_{n+1}$ fall on the stable manifold of the fixed point, i.e. requiring that $$f_u \cdot \xi_{n+1} = 0$$

in combination with Equation 5, this yields, $$p_n = \frac{\lambda_u \xi_n \cdot f_u}{(\lambda_u - 1) g \cdot f_u} = C \cdot \xi_n, \text{ where} \qquad \text{Eq. 6}$$

$$C = \frac{\lambda_u f_u}{(\lambda_u - 1) g \cdot f_u}.$$

The orbit about which control is desired can be readily determined by using standard embedding techniques, and using the above-described theoretical formulation applied to the experimental data. Therefore, if we have an unstable fixed point and want to maintain the point on the stable manifold, equations 4–6 may be used to stabilize the unstable fixed point by changing the accessible parameter. However, one must consider the noise present in each of the oscillators in the system. The presence of noise allows the iterates to be near the stable manifold, and the control will be robust with respect to the noise. Furthermore, as shown in FIG. 2b, the basin saddle points are hyperbolic under the noise generated by each of the oscillators. Accordingly, since the control is robust with respect to the noise and since the basin saddle points are hyperbolic, the hyperswitch will be effective in case of absence of perfect symmetry.

Figure 3B:
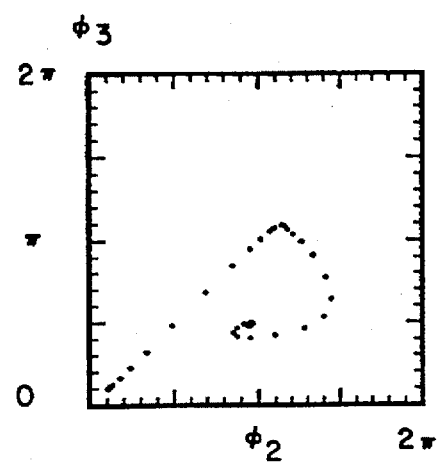
FIG. 3b is a diagram of the orbits attracted to a first anti-phase (AP) attractors after the control is turned off for a system of three globally coupled oscillators.
Figure 4A:
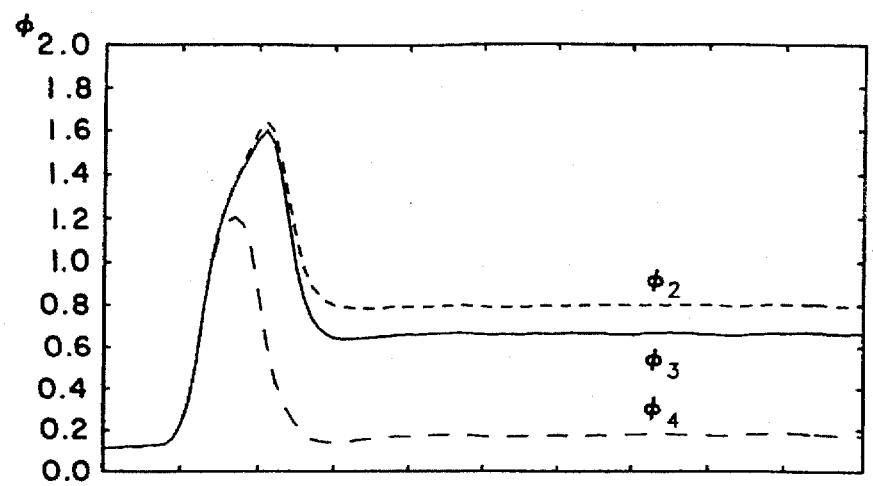
FIGS. 4a, 4b and 4c represent a time series diagram of a system of four globally coupled oscillators after control and release to three different AP states of the six possible orderings.
Figure 4B:
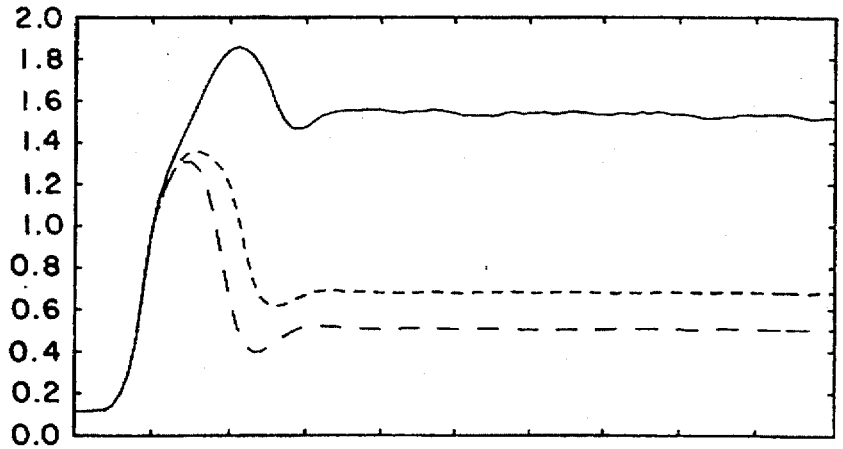
Figure 4C:
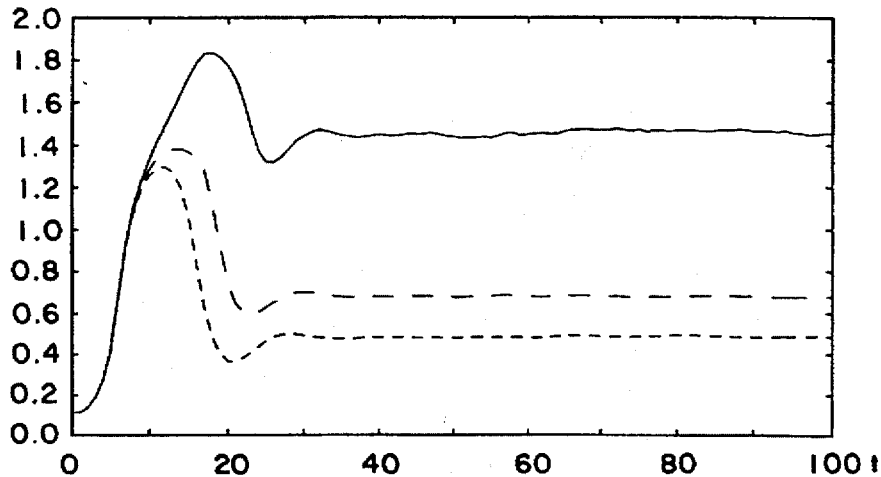

In order to switch from one AP state to another, Equation 6 is used to control the saddle on the basin boundary in an OP state between or among the attracting AP states. For example, we begin by having the system settled in a CIR. However, it is important to note that we may initiate this procedure with the system on the basin boundary. If we define the noise amplitude as n=0.0005 and we define the bias current B, such that B<$B_1$, the system will settle to an AP state, as shown in FIG. 3b and 4b respectively. To switch the system to another AP state, we must first bring the system back to the unstable fixed point between the CIRs, on the basin boundary between the AP states. The state of the system is switched by changing the value of B, such that B>$B_2$. The AP state where the system had been settled now becomes repulsive, and the topology shows how the corresponding dynamics spirals away from the fixed point, see FIG. 1c. As the orbit of the system approaches the saddle on the basin boundary between or among the invariant regions, the control fluctuations are implemented, see Eq. 6. The control parameter of the bias current B is now defined as B=$B_0$+$p_n$. Control of the orbit between CIRs is important to the method described above. When the orbit is on the basin boundary it is in an OP state, as seen in FIG. 2b which is an enlarged area of a portion of the basin boundary, which clearly displays how the orbit in the area of the basin boundary is not "stable". By implementing the control procedures, the orbit is maintained and controlled in the area of the basin boundary, and is further controlled and maintained so that the orbit should not become chaotic, nor should it enter an invariant region unless it is released from the basin boundary, i.e. the bias current is adjusted.

Using the control method discussed above, see Eq. 6, the bias current B is continuously adjusted about the direct current value of $B_0$. This shows the orbit to be maintained near the saddle on the basin boundary between or among the CIRs. As the control method is implemented, the orbit fluctuates around the saddle area on the edge separating the invariant regions, as shown in FIG. 2b. When the system is in the desired ordering, i.e. the orbit is near the saddle on the basin boundary, B is changed instantaneously such that B<$B_1$, again. The system now attracts to one of the AP states, where there is the only one attractor in each CIR. Once the system enters an invariant region it will remain there as long as the system is stable, and until the bias current is adjusted. Therefore, to access another AP state, the system must leave the CIR in which it is currently settled. The process of leaving the invariant region requires changing the bias current so that B>$B_2$. Again, the AP state now becomes repulsive, and the corresponding dynamics spiral away from the attractor. As the orbit approaches the saddle on the basin boundary separating the invariant regions, the control fluctuations of Eq. 6 are again implemented. Accordingly, the goal is to maintain the saddle on the basin boundary so that access to the AP attractors in each of the invariant regions may be achieved. In order to move from one invariant region to another, the system requires that the orbit become unstable until such time as it returns to the saddle on the basin boundary, at which time the system may enter another invariant region. In order to access the AP states as a source for potential memory, it is a requirement that the system be able to switch among the invariant regions, since there is only one AP attractor in each invariant region. As we increase the number of oscillators in the system, there still remains only one AP attractor in each CIR.

Figure 3A:
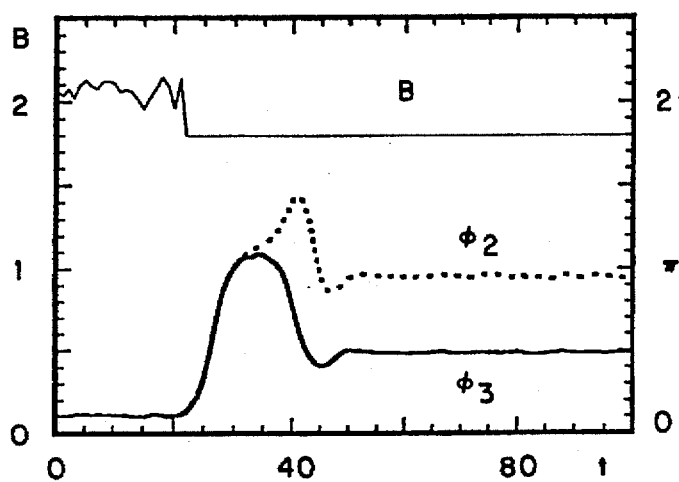
FIG. 3a is a diagram of time series of bias current and phases of two orbits, $\theta_2$ and $\theta_3$, in a switching process of a first desired ordering for three globally coupled oscillators.
Figure 3C:
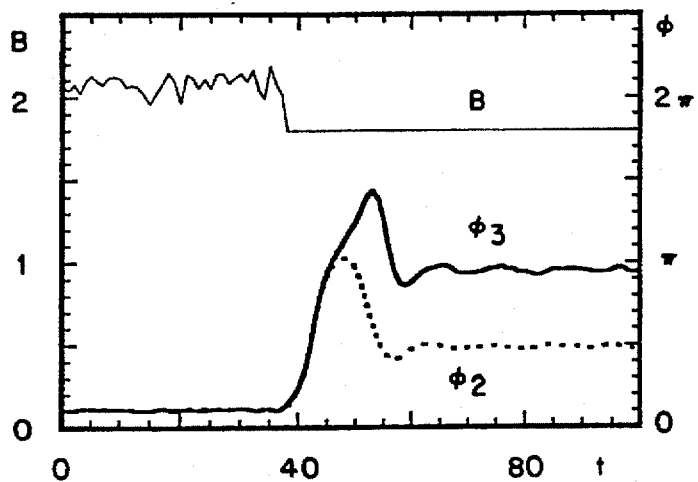
FIG. 3c is a diagram of time series of bias current and phases of two orbits, $\theta_2$ and $\theta_3$, in a switching process of a second desired ordering for three globally coupled oscillators.
Figure 3D:
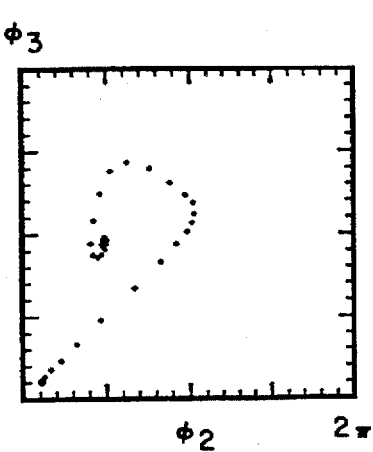
FIG. 3d is a diagram of orbits attracted to a second AP attractors after the control is turned off for a system of three globally coupled oscillators.

An example of the switching process showing the time series of the bias current, B, during two different switching processes is shown in FIG. 3a. When examining FIG. 3a together with 3b, which is a phase portrait of $\theta_2$ v. $\theta_3$, it is clear how the adjustment of the bias current such that B<$B_1$ allows the system to enter the invariant region and orbit toward the attractor. When the bias current is adjusted so that B=1.8 at t=21, the orbit is attracted to the AP state with the ordering of $\theta_2$>$\theta_3$. Similarly, FIGS. 3c and 3d are identical to FIGS. 3a and 3b above, with the exception of a different time ordering. As the bias current is adjusted so that B>$B_2$ it the orbit spirals away from the attractor and returns to the edge on the basin boundary. Once the system has returned to the basin boundary the system becomes stabilized, by means of the control procedure described above. FIGS. 3c and 3d are an example of the system entering another invariant region at a different time series and orbiting toward another attractor in another invariant region. As the bias current is adjusted so that B=1.8 at t=37, the system orbits toward an attractor in another AP state with the ordering of $\theta_2<\theta_3$. In each of these two sets of figures, the bias current B is changed to a value smaller than $B_1$ at two different times depending upon which ordering is desired. Each time we choose to switch to a different invariant region, we change the bias current such that $B>B_2$, and then repeat the switching process described above. The control and release procedures of the switching process is controlled by means of a hyperswitch. In order to make effective use of the AP states as a potential memory source the time intervals for switching must be accurate and discrete. In a preferred embodiment, the switching process described above continuously adjusts the linear parameter between said basin boundary and said canonical invariant regions at discrete time intervals.

The switching process described above was shown for a system of three globally coupled oscillators and the associated figures are a two dimensional representation of the system. However, three oscillators is only a minimum and the system may apply to a large array of oscillators. In an alternative embodiment, FIGS. 4a, b, and c show a system of four oscillators connected in series and globally coupled. Each of these figures show $\theta_2$, $\theta_3$ and $\theta_4$, as the phase of the first junction $\theta_1=0 \pmod{2\pi}$, i.e. this figure is equivalent to FIGS. 3a and 3c but with an additional oscillator globally coupled into the system. In a system of four globally coupled oscillators there are six AP states. The basin boundary is such that you can access any of the six AP states and the respective invariant regions by adjusting the bias current accordingly. The edge of the basin boundary is essentially a central axis of a tetrahedron with equidistant access to each of the invariant regions.

Although the present invention has been described in connection with preferred embodiments thereof, it will be appreciated by those skilled in the art that additions, deletions, modifications, and substitutions not specifically described may be made without departing from the spirit and scope of the invention as defined in the appended claims.

What is claimed:

1. An apparatus for accessing anti-phase states in a nonlinear system, comprising:

an array of globally coupled oscillators capable of generating a signal;

a means for controlling an orbit on a basin boundary by means of a linear parameter;

a means for releasing said orbit from said basin boundary to a canonical invariant region; and a means for controlling and releasing a saddle on a basin boundary between canonical invariant regions.

2. The apparatus of claim 1, wherein said controlling and releasing means being a hyper-switch.

3. The apparatus of claim 2, wherein said hyperswitch continuously adjusts the linear parameter between said basin boundary and said canonical invariant regions at discrete time intervals.

4. The apparatus of claim 1, wherein said basin boundary being an out-of-phase state.

5. The apparatus of claim 1, where said canonical invariant regions is anti-phase states and further comprising an attractor therein.

6. The apparatus of claim 1, wherein said linear parameter is a bias current.

7. The apparatus of claim 1, wherein said non-linear system comprising at least three oscillators.

8. The apparatus of claim 1, wherein said array of globally coupled oscillators is Josephson Junctions.

9. The apparatus of claim 1, wherein said array of globally coupled oscillators is optical waveguides.

10. The apparatus of claim 1, wherein said array of globally coupled oscillators is coupled semi-conductors.

11. The apparatus of claim 1, wherein said array of globally coupled oscillators is multi-mode lasers.

12. The apparatus of claim 1, wherein said array of globally coupled oscillators is neural networks.

13. The apparatus of claim 12, wherein a group of neurons form an individual oscillator.

14. The apparatus of claim 1, wherein said array of globally coupled oscillators is semi-conductor lasers.

15. The apparatus of claim 1, wherein said array of globally coupled oscillators is solid-state lasers.

16. A method of accessing anti-phase states in a nonlinear system, comprising the steps of:

globally coupling an array of oscillators capable of generating a signal;

controlling an orbit on a basin boundary among anti-phase states by means of a linear parameter;

releasing said orbit from the basin boundary to an anti-phase state in a canonical invariant region; and a means for switching said orbit between an anti-phase state in a canonical invariant region and said basin boundary.

17. The method of claim 16, wherein said linear parameter being a bias current.

18. The method of claim 16, wherein each canonical invariant region comprises a single anti-phase state.

19. The method of claim 18, wherein the anti-phase state in the canonical invariant region further comprises an attractor therein.

20. The method of claim 16, wherein said switching means being a hyper-switch.

21. The method of claim 16, wherein said switching means being independent of said nonlinear system.

22. The method of claim 16, wherein said array of globally coupled oscillators being Josephson Junctions.

23. The method of claim 16, wherein said array of globally coupled oscillators being optical waveguides.

24. The method of claim 16, wherein said array of globally coupled oscillators being coupled semi-conductors.

25. The method of claim 16, wherein said array of globally coupled oscillators being multi-mode lasers.

26. The method of claim 16, wherein said array of globally coupled oscillators being neural networks.

27. The method of claim 26, wherein groups of neurons form individual oscillators.

28. The method of claim 16, wherein said array of globally coupled oscillators being semi-conductor lasers.

29. The method of claim 16, wherein said array of globally coupled oscillators being solid state lasers.

30. The method of claim 16, wherein said nonlinear system having a minimum of three oscillators.

31. The method of claim 16, wherein said switching means continuously adjusts said linear parameter between said basin boundary and said canonical invariant region at discrete time intervals.

* * * * *